(12) United States Patent
Rakshit et al.

(10) Patent No.: US 7,700,975 B2
(45) Date of Patent: Apr. 20, 2010

(54) SCHOTTKY BARRIER METAL-GERMANIUM CONTACT IN METAL-GERMANIUM-METAL PHOTODETECTORS

(75) Inventors: Titash Rakshit, Hillsboro, OR (US); Miriam Reshotko, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 674 days.

(21) Appl. No.: 11/394,817

(22) Filed: Mar. 31, 2006

(65) Prior Publication Data

US 2007/0235824 A1    Oct. 11, 2007

(51) Int. Cl.
| | |
|---|---|
| H01L 29/739 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/80 | (2006.01) |
| H01L 31/112 | (2006.01) |
| H01L 31/00 | (2006.01) |
| H01L 27/095 | (2006.01) |
| H01L 29/47 | (2006.01) |
| H01L 29/812 | (2006.01) |
| H01L 31/07 | (2006.01) |

(52) U.S. Cl. ............ 257/194; 257/54; 257/73; 257/155; 257/195; 257/260; 257/280; 257/281; 257/449; 257/471; 257/E29.246; 257/E29.247; 257/E29.248; 257/E29.249; 257/E29.25; 257/E29.251; 257/E29.252; 257/E29.253; 257/E29.254

(58) Field of Classification Search ............ 257/54, 257/73, 155, 260, 280–281, 449, 471, 194–195, 257/E29.246–E29.254

See application file for complete search history.

(56) References Cited

U.S. PATENT DOCUMENTS

| | | | |
|---|---|---|---|
| 4,651,180 A | | 3/1987 | Nishizawa et al. |
| 4,780,748 A | * | 10/1988 | Cunningham et al. ......... 257/24 |

(Continued)

FOREIGN PATENT DOCUMENTS

JP    2000021783 A    *    1/2000

OTHER PUBLICATIONS

Buca, et al., "Metal-germanium-metal ultrafast infrared detectors", Journal of Applied Physics, vol. 92, No. 12, Dec. 15, 2002, http://jap/copyright.jsp, pp. 7599-7605.

(Continued)

*Primary Examiner*—Ida M Soward
(74) *Attorney, Agent, or Firm*—Blakely, Sokoloff, Taylor & Zafman LLP

(57) ABSTRACT

Metal-Semiconductor-Metal ("MSM") photodetectors and methods to fabricate thereof are described. The MSM photodetector includes a thin heavily doped ("delta doped") layer deposited at an interface between metal contacts and a semiconductor layer to reduce a dark current of the MSM photodetector. In one embodiment, the semiconductor layer is an intrinsic semiconductor layer. In one embodiment, the thickness of the delta doped layer is less than 100 nanometers. In one embodiment, the delta doped layer has a dopant concentration of at least $1 \times 10^{18}$ cm$^{-3}$. A delta doped layer is formed on portions of a semiconductor layer over a substrate. Metal contacts are formed on the delta doped layer. A buffer layer may be formed between the substrate and the semiconductor layer. In one embodiment, the substrate includes silicon, and the semiconductor layer includes germanium.

17 Claims, 5 Drawing Sheets

U.S. PATENT DOCUMENTS

| | | | |
|---|---|---|---|
| 5,043,776 A * | 8/1991 | Hida | 257/272 |
| 5,158,896 A | 10/1992 | Burroughes et al. | |
| 5,241,197 A * | 8/1993 | Murakami et al. | 257/192 |
| 5,302,840 A * | 4/1994 | Takikawa | 257/194 |
| 5,442,205 A * | 8/1995 | Brasen et al. | 257/191 |
| 5,548,128 A | 8/1996 | Soref et al. | |
| 5,561,305 A * | 10/1996 | Smith | 257/194 |
| 5,605,856 A | 2/1997 | Goosen et al. | |
| 5,977,571 A | 11/1999 | Goossen | |
| 5,981,986 A * | 11/1999 | Tsuchiya | 257/200 |
| 6,075,275 A | 6/2000 | Irissou | |
| 6,190,975 B1 * | 2/2001 | Kubo et al. | 438/285 |
| 6,246,708 B1 | 6/2001 | Thornton et al. | |
| 6,346,700 B1 * | 2/2002 | Cunningham et al. | 250/214.1 |
| 6,498,360 B1 * | 12/2002 | Jain et al. | 257/194 |
| 6,597,713 B2 | 7/2003 | Ouchi | |
| 6,627,473 B1 * | 9/2003 | Oikawa et al. | 438/46 |
| 6,809,358 B2 | 10/2004 | Hsieh et al. | |
| 6,821,793 B2 | 11/2004 | Verdonk et al. | |
| 6,903,432 B2 | 6/2005 | Reshotko et al. | |
| 7,170,120 B2 * | 1/2007 | Datta et al. | 257/288 |
| 7,208,775 B2 * | 4/2007 | Osipov et al. | 257/103 |
| 7,425,460 B2 | 9/2008 | Pain | |
| 2002/0187623 A1 * | 12/2002 | Oikawa et al. | 438/590 |
| 2003/0020136 A1 * | 1/2003 | Kitabatake et al. | 257/502 |
| 2003/0141518 A1 * | 7/2003 | Yokogawa et al. | 257/194 |
| 2004/0022025 A1 * | 2/2004 | Yokogawa et al. | 361/695 |
| 2004/0081216 A1 * | 4/2004 | Dehmubed et al. | 372/50 |
| 2004/0089905 A1 * | 5/2004 | Ossipov et al. | 257/424 |
| 2005/0001217 A1 * | 1/2005 | Kusumoto et al. | 257/77 |
| 2005/0035381 A1 | 2/2005 | Holm et al. | |
| 2005/0082568 A1 * | 4/2005 | Hirose et al. | 257/192 |
| 2005/0173739 A1 * | 8/2005 | Kusumoto et al. | 257/263 |
| 2005/0202312 A1 | 9/2005 | Reshotko et al. | |
| 2005/0218465 A1 | 10/2005 | Cummins | |
| 2005/0233493 A1 | 10/2005 | Augusto | |
| 2006/0197107 A1 * | 9/2006 | Kanamura et al. | 257/194 |
| 2007/0019900 A1 * | 1/2007 | Taylor et al. | 385/14 |
| 2007/0138565 A1 * | 6/2007 | Datta et al. | 257/369 |
| 2007/0235877 A1 | 10/2007 | Reshotko et al. | |
| 2008/0001181 A1 | 1/2008 | Rakshit et al. | |
| 2008/0054304 A1 * | 3/2008 | Sadaka et al. | 257/194 |

OTHER PUBLICATIONS

Han, et al.. "Barrier height modification of metal/germanium Schottky diodes", Department of Electrical and Computer Engineering, R-007, University of California, San Diego, La Jolla, California 92093-0407, 1988 American Vacuum Society, pp. 1662-1666.

Oh, et al., "Metal-Germanium-Metal Photodetectors on Heteroepitaxial Ge-on-Si With Amorphous Ge Schottky Barrier Enhancement Layers", IEEE Photonics Technology Letters, vol. 16, No. 2, Feb. 2004, pp. 581-583.

PCT/US2007/008007, International Search Report.

"PCT International Preliminary Report on Patentability", PCT/US2007/008007, Oct. 9, 2008, 6 pages.

* cited by examiner

SCHOTTKY BARRIER METAL-GERMANIUM CONTACT IN METAL-GERMANIUM-METAL PHOTODETECTORS

FIELD

Embodiments of the invention relate generally to the field of semiconductor manufacturing, and more specifically, to semiconductor photodetectors and methods to fabricate thereof.

BACKGROUND

Currently, dimensions of integrated circuits continue to be scaled down while signal frequencies continue to increase. Scaling down the dimensions of integrated circuits and higher frequencies may put limitations on use of the electrical interconnects, especially for the longer global interconnects. On-chip optical interconnects have the potential to overcome limitations of the electrical interconnects, especially limitations of the global electrical interconnects. A typical optical interconnect link includes a photodetector. Two of the critical parameters of the photodetector are the dark current and the signal-to-noise ratio ("SNR"). The dark current is generally defined as a current that flows in the photodetector when there is no optical radiation incident on the photodetector and operating voltages are applied. Generally, the signal-to-noise ratio ("SNR") may be defined as a ratio of a photocurrent ("signal") to a dark current ("noise"). Therefore, a low dark current is essential for the photodetectors to have a high SNR.

One of the key components of an on-chip optical interconnect link is a photodetector. In order that optical interconnects be useful with today's prevailing microelectronic processes, it is important that such a photodetector can be fabricated using silicon process-based technology and that the method of fabrication can be incorporated in a silicon process flow. A metal-germanium-metal ("MGM") photodetector grown on a silicon substrate is one such example. Due to the presence of high density of interface energy states, the work function of a metal at a metal-germanium ("M-Ge") interface is pinned at an energy level within approximately 50 meV of the Ge valence band edge independent of the type of contacting metal. Such pinning of the work function renders a metal germanium interface ohmic. Generally, the ohmic type contact has linear and symmetric current-voltage characteristics. The ohmic MGe interface results in a high value of the dark current. The dark current of the MGM photodetectors having such ohmic contact increases by several orders of magnitude and leads to a poor SNR, which is not desired for the performance of MGM photodetectors.

Currently, one way to reduce the dark current of the MGM photodetector involves passivating the surface of Ge by depositing an insulating silicon oxide on a surface of germanium. Another way to reduce the dark current of the Ge photodetector involves inserting an insulating amorphous Ge ("α-Ge") layer between the metal (e.g., silver) contacts and a germanium channel layer. FIG. 1 shows a cross sectional view 100 of an MGM photodetector having an insulating amorphous germanium ("α-Ge") layer 103 between silver contacts 104 and a germanium channel layer 102. As shown in FIG. 1, an epitaxial germanium channel layer 102 is grown on a silicon substrate 101. As shown in FIG. 1, an insulating amorphous α-Ge layer 103 is inserted between silver contacts 104 and germanium channel layer 102. Insulating amorphous α-Ge layer 103 forms an insulating tunnel barrier at the interface between germanium channel layer 102 and silver contacts 104.

Inserting an insulating layer between the metal contacts and the germanium channel layer, however, may reduce the photocurrent that flows through the metal-semiconductor interface. Reduction in the photocurrent affects the overall performance of the MGM photodetectors. Additionally, inserting the insulating layer between metal contacts and the germanium channel layer may reduce the electric field available in the germanium channel region thus reducing the photocurrent and possibly the SNR further.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
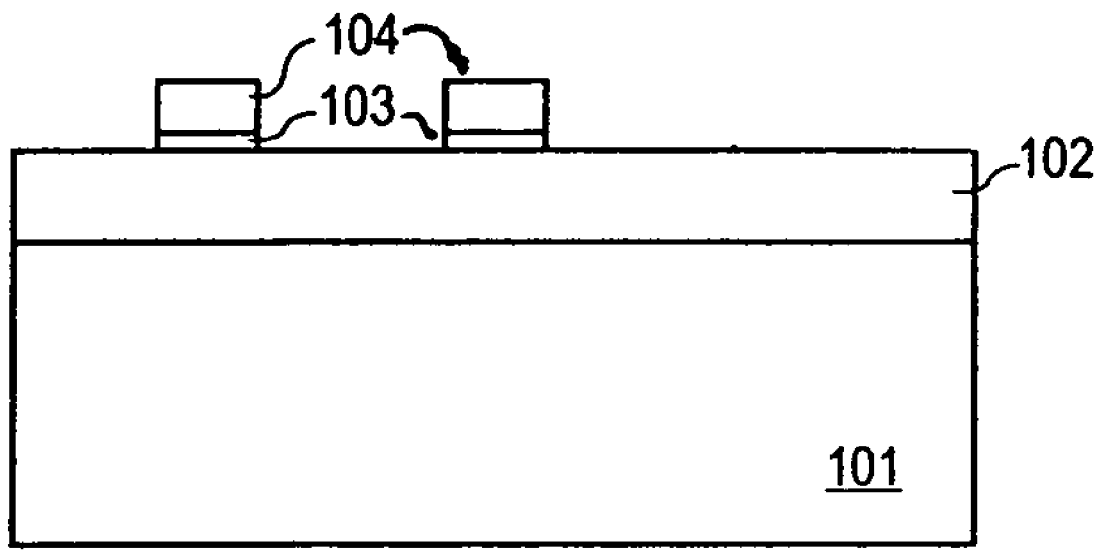
FIG. 1 shows a cross sectional view of an MGM photodetector having an insulating amorphous alpha-germanium layer between silver contacts and a germanium channel layer.

In the following description, numerous specific details, such as specific materials, dimensions of the elements, chemical names, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Metal-Semiconductor-Metal ("MSM") photodetectors and methods to fabricate thereof are described. In one embodiment, the engineering of the work function at the metal-germanium ("MGe") interface is performed such that contacts are converted from ohmic ones to Schottky ones thus reducing the dark current and improving the SNR of the MGM photodetector. An MSM photodetector includes a semiconductor layer to provide a photodetector body ("channel") and metal contacts formed over a top surface of the semiconductor layer at opposite ends of the photodetector channel. Further, the MSM photodetector includes a thin heavily doped ("delta doped") layer deposited beneath metal contacts on portions of the top surface of the semiconductor layer. Heavy delta doping of the Ge layer (205 in FIG. 2) in contact with the metallic electrodes leads to a barrier height modulation at the MGe interface, as described in further detail below. The height of the barrier can be controlled by the depth and doping of the delta-doped layer of Ge at the interface. The delta doped layer provides a Schottky barrier type of interface between metal contacts and the portions of the semiconductor layer, as described in further detail below. The delta doped layer deposited between metal contacts and the portions of the semiconductor layer reduces a dark current of the MSM photodetector and increases the signal-to-noise ratio ("SNR") of the MSM photodetector. Computer simulations indicate that the dark current can be reduced for a photodetector with such MGe contacts by at least one order of a magnitude compared to the current state-of-the-art, which in turn significantly improves a signal-to-noise ratio. In one embodiment, the semiconductor channel layer is a layer of an intrinsic semiconductor that has a carrier concentration less than $10^{15}$ cm$^{-3}$. The delta doped layer formed to provide the interface between the metal contacts and the intrinsic semiconductor channel layer may be an n-type, or a p-type semiconductor layer. In one embodiment, the delta doped layer deposited on portions of the surface of the semiconductor layer beneath metal contacts has a thickness less than 30 nanometers and a dopant concentration (e.g., the concentration of n-type dopants, or p-type dopants) of at least $10^{18}$ cm$^{-3}$. In one embodiment, the delta doped layer of germanium ("Ge") is formed between the metal contacts and portions of the top surface of the intrinsic Ge layer to provide a Schottky barrier interface, as described in further details below. In one embodiment, the MSM photodetector having the delta doped layer to provide a Schottky barrier interface is compatible with silicon processing technology, as described in further detail below.

Figure 2:
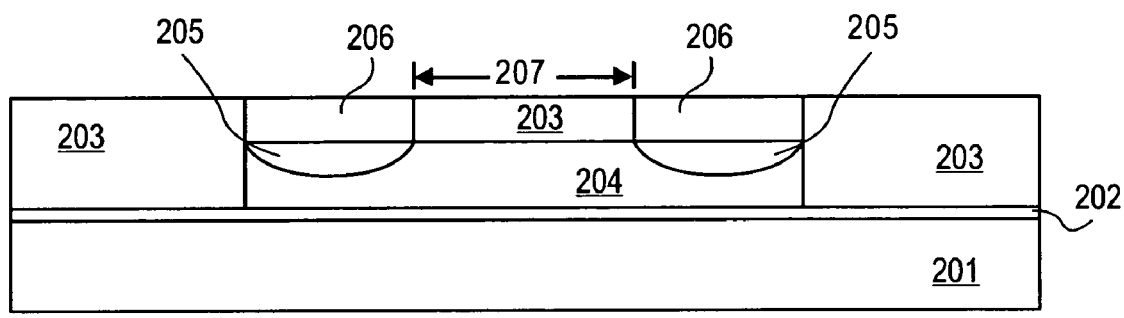
FIG. 2 is a cross-sectional view of one embodiment of an MSM photodetector.

FIG. 2 is a cross-sectional view of one embodiment of an MSM photodetector 200. As shown in FIG. 2, MSM photodetector 200 includes a semiconductor channel layer 204 deposited on a buffer layer 202 on a substrate 201. In one embodiment, substrate 201 includes monocrystalline silicon. In alternate embodiments, substrate 201 may comprise any material that is used to make any of integrated circuits, passive, and active devices. Substrate 201 may include insulating materials that separate such active and passive devices from a conductive layer or layers that are formed on top of them. Buffer layer 202 may be optionally deposited on substrate 201 to relieve strain that may be induced by the lattice mismatch between substrate 201 and semiconductor channel layer 204, as shown in FIG. 2. For example, semiconductor layer 204 of Ge may be formed on buffer layer 202 of SiGe on substrate 201 of monocrystalline silicon, as described in further detail below. As shown in FIG. 2, two metal contacts 206 are formed over two portions of the top surface of semiconductor channel layer 204. In one embodiment, metal contacts 206 include copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof. In one embodiment, metal contacts 206 include a metal alloy or a compound (e.g., a metal nitride) that include copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof. As shown in FIG. 2, metal contacts 206 are separated by an insulating layer 203 (e.g., silicon oxide, silicon nitride, or any other insulating layer) deposited on the top surface of semiconductor channel layer 204. In one embodiment, distance 207 between metal contacts 206 establishes a minimal window on a semiconductor channel of MSM photodetector 200. The minimal window on the semiconductor channel of the MSM photodetector 200 may be, e.g., in the approximate range of 10 nanometers ("nm") to 20 microns ("μm") depending on the design. In one embodiment, semiconductor channel layer 204 is a layer of an intrinsic semiconductor. Generally, the intrinsic semiconductor may be defined as a semiconductor, which is only nominally doped. In other words, dopants, e.g., p-type dopants, and/or n-type dopants, are not intentionally added to the intrinsic semiconductor. Typically, the intrinsic semiconductor has the concentration of carriers (e.g., electrons, and/or holes) less than $1\times10^{15}$ cm$^{-3}$. In another embodiment, semiconductor channel layer 204 is a p-type semiconductor. In yet another embodiment, semiconductor channel layer 204 is an n-type semiconductor. A substantially thin heavily doped semiconductor layer ("delta doped layer") 205 is formed on portions of the surface of semiconductor channel layer 204 beneath each of the metal contacts 206, as shown in FIG. 2. Delta doped layer 205 is substantially thin, such that dopants occupy a very small area, e.g., not more than 100 nm at the interface between metal contacts 206 and semiconductor channel layer 204. Delta doped layer 205 is deposited at the interface between semiconductor channel layer 204 and metal contacts 206 to reduce the dark current of MSM photodetector 200, as described in further detail below. As shown in FIG. 2, delta doped layer 205 is formed on semiconductor channel layer 204 beneath metal contacts 206 to provide a metal-semiconductor ("MS") interface work function such, that the MS interface is converted from an ohmic type contact to a Schottky barrier type contact. A Schottky barrier type contact has non-linear and asymmetric ("rectifying", or "diode-like") current-voltage characteristics. The ohmic type contacts and the Schottky barrier type contacts are known to one of skilled in the art of semiconductor manufacturing. In one embodiment, by forming delta doped layer 205 of germanium having a dopant concentration at least $1\times10^{18}$ cm$^{-3}$ between metal contacts 206 and semiconductor channel layer 205 of intrinsic Ge, the MGe interface is converted from an ohmic type contact to a Schottky barrier type contact. In one embodiment, the thickness of delta doped layer 205 of Ge is less than 100 nanometers ("nm") to provide an MGe interface work function such that the MGe interface is a Schottky barrier type contact. In another embodiment, the thickness of delta doped layer 205 is in the approximate range of 5 nm to 20 nanometers. In one embodiment, the thickness of delta doped layer 205 determines the height of the Schottky barrier (not shown), whereby controlling the reduction of the dark current of MSM photodetector 200. In another embodiment, the dopant concentration of delta doped layer 205 determines the height of the Schottky barrier (not shown), whereby controlling the reduction of the dark current of MSM photodetector 200. That is, by controlling the thickness and/or doping concentration of delta doped layer 205 at the metal-semiconductor interface, the reduction of dark current in MSM photodetector 200 is controlled. As shown in FIG. 2, insulating layer 203 is deposited on buffer layer 202 on substrate 201 adjacent to opposite sidewalls of semiconductor channel layer 204. In one embodiment, insulating layer 203 may be any one, or a combination of, silicon dioxide, silicon nitride, polymer, sapphire, or other insulating materials. Computer simulations indicate that forming a delta doped layer 205 on portions of the surface of semiconductor channel layer 204 immediately beneath metal contacts 206 reduces the dark current of MSM photodetector 200 by at least 1 order of a magnitude compared with the present state of the art. For example, for a bias voltage of about 1 volt (V) applied to MSM photodetector 200, forming delta doped layer 205 reduces the dark current by at least two orders of magnitude.

Figure 3A:
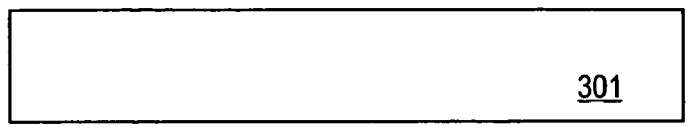
FIG. 3A is a cross-sectional view of one embodiment of a semiconductor structure 300 to fabricate an MSM photodetector.

FIG. 3A is a cross-sectional view of one embodiment of a semiconductor structure 300 to fabricate an MSM photodetector. As shown in FIG. 3A, semiconductor structure 300 includes a substrate 301. In one embodiment, substrate 301 includes monocrystalline silicon. In one embodiment, substrate 301 is a p-Si substrate. In alternate embodiments, substrate 301 comprises any material used to make integrated circuits, passive, and/or active devices, e.g., gallium arsenide ("GaAs"), indium gallium arsenide ("InGaAs"), silicon carbide ("SiC"), and/or any other semiconductor materials. Substrate 301 may include insulating materials, e.g, silicon oxide, silicon nitride, polymers that separate such active and passive devices from a conductive layer or layers that are formed on top of them.

Figure 3B:
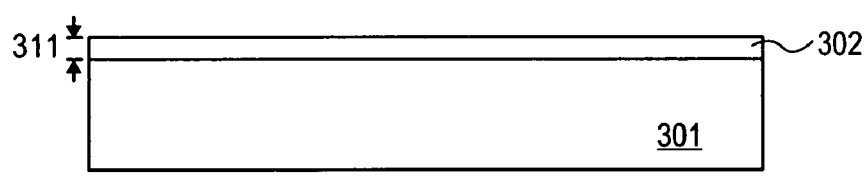
FIG. 3B is a view similar to FIG. 3A, after a buffer layer is formed on a substrate.

FIG. 3B is a view similar to FIG. 3A, after a buffer layer 302 is formed on top of substrate 301. As shown in FIG. 3B, buffer layer 302 may be deposited on substrate 301 to overcome a lattice mismatch between substrate 301 and a semiconductor layer formed over substrate 301 later on in the process. Such a lattice mismatch may lead to many defects, e.g., threading dislocations, stress or strains in the semiconductor layer. Buffer layer 302 is formed to compensate for the lattice mismatch and relieve strain between substrate 301 and a semiconductor channel layer formed later on in the process. Buffer layer 302 may be formed on substrate 301 using one of techniques known to one of ordinary skill in the art of semiconductor manufacturing, e.g., a blanket deposition technique such as molecular beam epitaxy ("MBE"), chemical vapor deposition ("CVD"), or sputtering. In one embodiment, buffer layer 302 of $Si_xGe_{1-x}$ is epitaxially grown on substrate 301 of monocrystalline silicon to compensate for about 4% lattice mismatch between Si substrate and a Ge layer formed later on in the process. In one embodiment, the relative content X of Si in buffer layer 302 of $Si_xGe_{1-x}$ gradually decreases from 1 at the top surface of substrate 301 of Si to 0 at the top surface of the buffer layer 302. In one embodiment, the thickness of buffer layer 302 is in the approximate range of 200 angstroms ("521") to 10 μm. Depositing a $Si_xGe_{1-x}$ layer on a silicon substrate is known to one of ordinary skill in the art of semiconductor manufacturing.

Figure 3C:
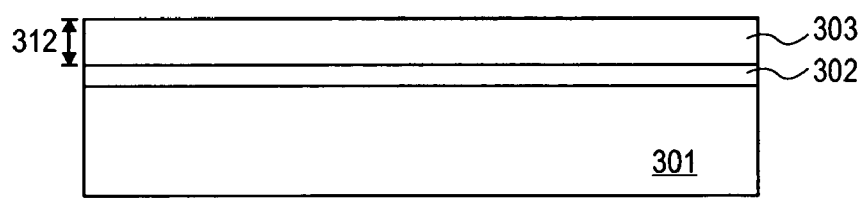
FIG. 3C is a view similar to FIG. 3B, after a semiconductor layer is formed on the buffer layer.

FIG. 3C is a view similar to FIG. 3B, after a semiconductor layer 303 is formed on buffer layer 302. Semiconductor layer 303 deposited on buffer layer 302 provides a channel for an MSM photodetector. In one embodiment, semiconductor layer 303 is an intrinsic semiconductor layer having a concentration of carriers (e.g., electrons, and/or holes) less than $1\times10^{15}$ cm$^{-3}$. In one embodiment, a carrier concentration in intrinsic semiconductor layer 303 is in the approximate range of $1\times10^{12}$ cm$^{-3}$ to $1\times10^{15}$ cm$^{-3}$. In another embodiment, semiconductor layer 303 is an n-type layer having a concentration of electrons between about $5\times10^{13}$ cm$^{-3}$ to about $10^{18}$ cm$^{-3}$. In yet another embodiment, semiconductor layer 303 is a p-type layer having a concentration of holes about $5\times10^{13}$ cm$^{-3}$ to about $10^{18}$ cm$^{-3}$. Semiconductor layer 303 may be any one, or a combination of, semiconductor materials, e.g., germanium, silicon, GaAs, SiC, GaN, InGaAs, InSb, SiC, or other semiconductor materials. In one embodiment, semiconductor layer 303 of intrinsic Ge having a carrier concentration less than $1\times10^{15}$ cm$^{-3}$ is deposited on buffer layer 302 of $Si_xGe_{1-x}$. The relative content X of Si in buffer layer 302 of is gradually reduced from 1 at substrate 301 of silicon to zero at semiconductor layer 303 of Ge. In another embodiment, semiconductor layer 303 is formed directly on substrate 301 without buffer layer 302. For example, semiconductor layer 303 of Si may be formed directly on substrate 301 of monocrystalline silicon. Semiconductor layer 303 may be deposited over substrate 301 using one of techniques known to one of ordinary skill in the art of semiconductor manufacturing, e.g., using a molecular beam epitaxy ("MBE"), chemical vapor deposition ("CVD"), and sputtering. In one embodiment, the thickness 312 of semiconductor layer 303 is between about 10 nm to about 10 μm. Thickness 312 of semiconductor layer 303 may depend on operating parameters (wavelength, responsivity, speed) of the MSM photodetector. For example, if the operating wavelength is about 1550 nm, a thinner semiconductor layer 303 of Ge may be formed to provide higher speed, and a thicker semiconductor layer 303 of Ge may be formed to provide higher responsivity. For example, if the operating wavelength is about 850 nm that may be absorbed by both Ge and Si materials, a thicker semiconductor layer 303 of Ge may be formed to provide higher speed (because the carriers are not absorbed as much by the substrate if the channel is thicker). In one embodiment, the thickness of semiconductor layer 303 of Ge is in the approximate range of 0.1 μm to 1.5 μm to absorb the infrared light having wavelengths between about 850 nm to about 1550 nm.

Figure 3D:
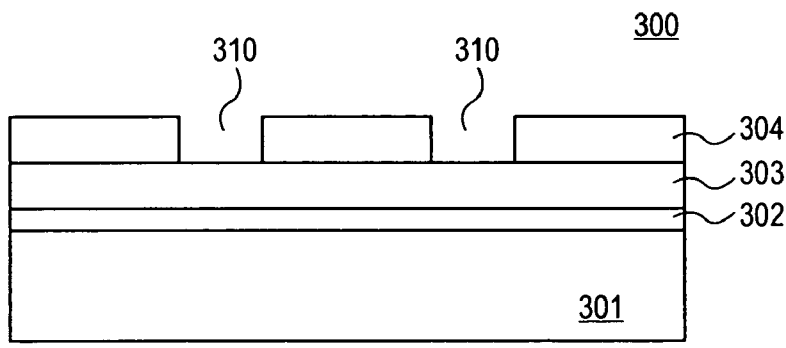
FIG. 3D is a view similar to FIG. 3C, after a photoresist layer is formed on the semiconductor layer.

FIG. 3D is a view similar to FIG. 3C, after a photoresist layer 304 is formed on semiconductor layer 303. As shown in FIG. 3D, photoresist layer 304 is patterned to form openings to expose portions 310 of semiconductor layer 303. Patterning (depositing, exposing and developing) of photoresist layer 304 on semiconductor layer 303 is known to one of ordinary skill in the art of semiconductor manufacturing. In one embodiment, the size of portions 310 exposed in openings in photoresist layer 304 is defined by the size of contacts formed later on in the process.

Figure 3E:
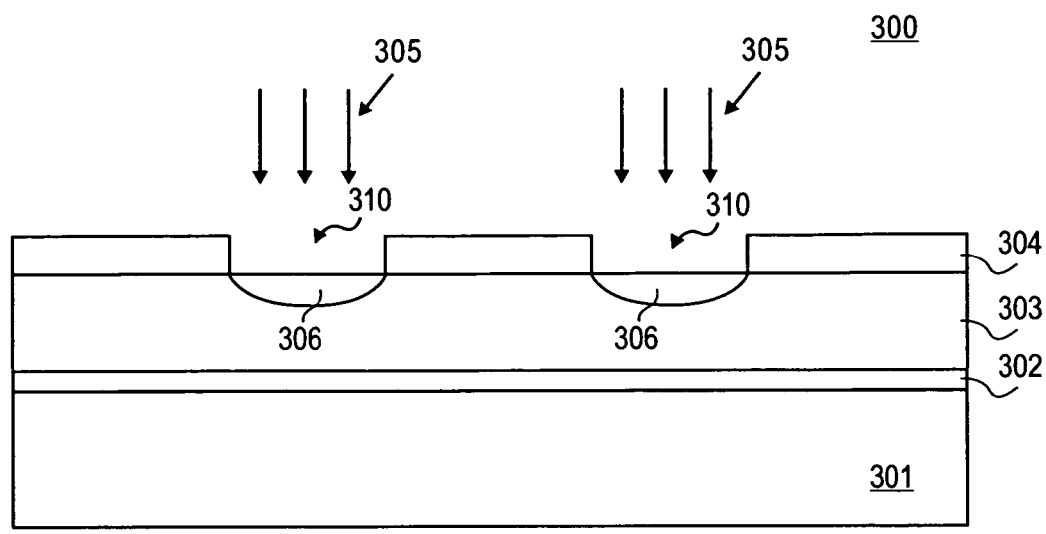
FIG. 3E is a view similar to FIG. 3D, after a delta-doped layer is deposited onto portions of the semiconductor layer.

FIG. 3E is a view similar to FIG. 3D, after a delta-doped layer 306 is deposited onto portions 310 of semiconductor layer 303. Delta-doped layer 306 is a heavily doped thin semiconductor layer. In one embodiment, the thickness of delta doped layer 306 is varied to control the height of a Schottky barrier at a metal-semiconductor layer 303 interface formed later on in the process. In another embodiment, a dopant concentration in delta doped layer 306 is varied to control the height of a Schottky barrier at a metal-semiconductor layer 303 interface formed later on in the process.

In one embodiment, the concentration of dopants (e.g., n-type, or p-type dopants) in delta-doped layer 306 is higher than the concentration of dopants in semiconductor layer 303 by at least two orders of magnitude. In one embodiment, a dopant concentration in delta-doped layer 306 is at least 1×1018 cm−3, and a carrier concentration in semiconductor layer 303 is less than 1×1016 cm−3. In one embodiment, the thickness of delta-doped layer 306 is smaller than the thickness of semiconductor layer 303 by at least a factor of 5. For example, the thickness of delta-doped layer 306 may be less than 100 nm, and the thickness of semiconductor layer 303 may be at least 150 nm. In another embodiment, the thickness of delta-doped layer 306 may be less than 100 nm. In one embodiment, delta-doped layer 306 is an n-type semiconductor layer having an n-type dopant concentration of at least 1×1018 cm−3. In another embodiment, delta-doped layer 306 is a p-type semiconductor layer having a p-type dopant concentration of at least 1×1018 cm−3. In one embodiment, delta-doped layer 306 has a dopant concentration in the approximate range of 1×1018 cm−3 to 1×1021 cm−3. In one embodiment, delta-doped layer 306 is formed by adding dopants 305 onto portions 310 of semiconductor layer 303, as shown in FIG. 3E. In one embodiment, delta-doped layer 306 of Ge having a dopant concentration of at least 1×1018 cm−3 may be formed by adding n-type dopants (e.g., arsenic (As), phosphorus (P), antimony (Sb)) into portions 310 of semiconductor layer 303 of Ge. In another embodiment, delta-doped layer 306 of Ge having a dopant concentration of at least 1×1018 cm−3 may be formed by adding p-type dopants (e.g., boron (B)) into portions 310 of semiconductor layer 303 of Ge.

Delta-doped layer 306 can be formed on portions 310 of semiconductor layer 303 using one of techniques known to one of ordinary skill in the art of semiconductor manufacturing, e.g. using ion implantation, blanket deposition (e.g., epitaxy), diffusion, and spin coating. In one embodiment, the energy of dopant ions during ion implantation is maintained such, that the thickness of delta-doped layer 306 does not exceed 100 nm. In one embodiment, the dose of dopant ions during ion implantation is maintained to provide a dopant concentration of at least $5 \times 10^{18}$ cm$^{-3}$ in delta-doped layer 306. In one embodiment, after ion implantation, semiconductor structure 300 is annealed to activate dopants in delta-doped layer 306. In one embodiment, annealing temperature to activate dopants in delta-doped layer 306 is in the approximate range of 200° C. to 700° C.

Figure 3F:
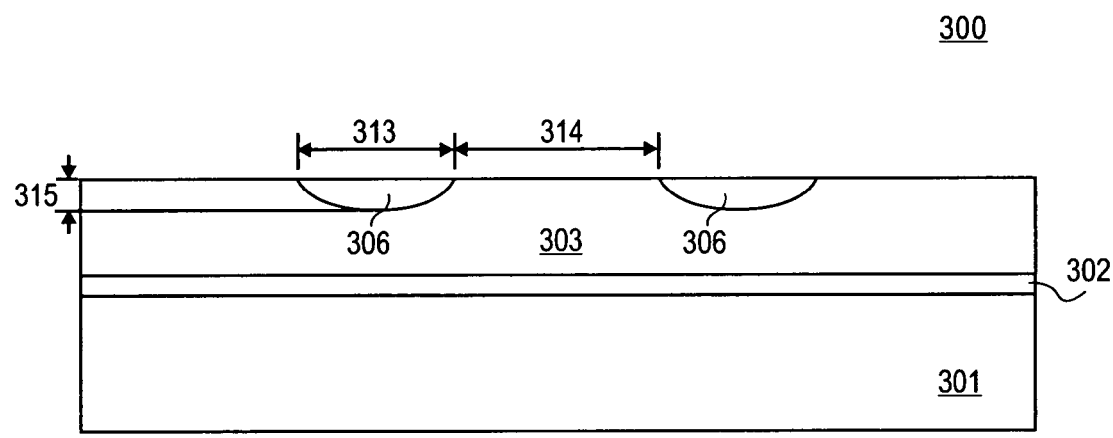
FIG. 3F is a view similar to FIG. 3E, after the photoresist layer has been removed from the semiconductor layer.

FIG. 3F is a view similar to FIG. 3E, after photoresist layer 304 has been removed from the surface of semiconductor layer 303. As shown in FIG. 3F, delta-doped layer 306 is formed on portions of semiconductor layer 303. In one embodiment, the thickness 315 of delta-doped layer 306 is less than 100 nm. In one embodiment, delta-doped layer 306 is formed by implanting ions of As, P, Sb, or B into portions of semiconductor layer 303 of Ge to a depth (thickness 315) less than 100 nm. In another embodiment, the thickness 315 of delta-doped layer 303 is in the approximate range of 10 nm to 20 nm. In one embodiment, delta-doped layer 306 of Ge having a dopant concentration of at least $5 \times 10^{18}$ cm$^{-3}$ is deposited onto portions of semiconductor layer 303 of intrinsic Ge having a concentration less than $1 \times 10^{15}$ cm$^{-3}$. As shown in FIG. 3F, delta-doped layer 306 is deposited on portions of semiconductor layer 303. The width 313 of each portion of delta-doped layer 306 depends on the size of a contact deposited thereupon. Distance 314 ("pitch") between portions of delta layer 306 is defined by parameters of MSM photodetector, e.g., light collecting efficiency, the size, and/or speed. In one embodiment, each dimension (side) of MSM photodetector may be in the approximate range of 1 μm to 100 μm. The width 313 and the distance 314 define the size of contacts and the distance between contacts (pitch) formed later on in the process. Typically, the pitch is referred to the distance between contacts in the periodic array of contacts (electrodes), for example, interdigitated electrodes. The size of the contacts and the distance between contacts determine the speed and a light collection of an MSM photodetector. For example, smaller size of contacts may increase the light collection by the photodetector, and smaller pitch may increase the speed of the photodetector. In one embodiment, width 313 is in the approximate range of 10 nm to 10 μm, and distance 314 is in the approximate range of 10 nm to 100 μm.

Figure 3G:
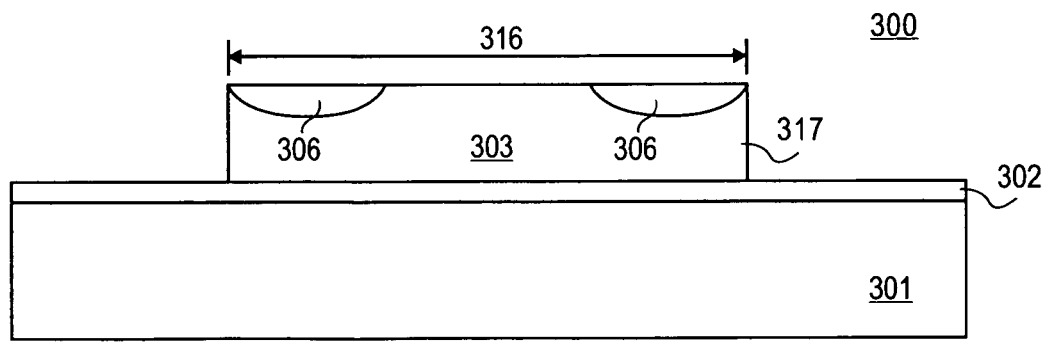
FIG. 3G is a view similar to FIG. 3F, after forming a photodetector body on the buffer layer on the substrate.

FIG. 3G is a view similar to FIG. 3F, after forming a photodetector body 317 on buffer layer 302 on substrate 301. As shown in FIG. 3G, photodetector body 317 has delta doped layer 306 on portions 310 of the top surface of semiconductor layer 303. In one embodiment, photodetector body 316 is formed by patterning and etching semiconductor layer 303 to width 316. Patterning and etching of semiconductor layer 303 is known to one of ordinary skill in the art of semiconductor manufacturing. In one embodiment, width 316 of the photodetector body 317 is in the approximate range of 10 nm to 100 μm.

Figure 3H:
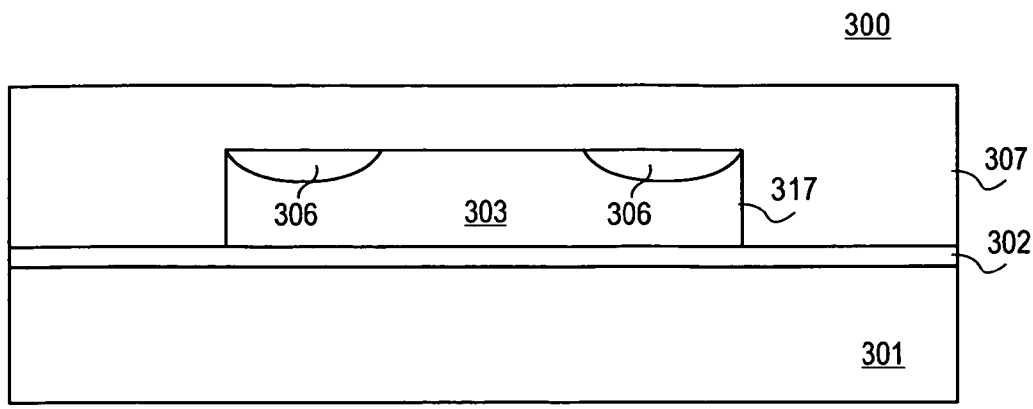
FIG. 3H is a view similar to FIG. 3G, after another insulating layer is formed to overcoat the photodetector body and portions of the buffer layer.

FIG. 3H is a view similar to FIG. 3G, after insulating layer 307 is formed to overcoat photodetector body 317 and portions of buffer layer 302. In one embodiment, insulating layer 307 that includes oxide, e.g., silicon dioxide, is deposited onto photodetector body 317 that includes Ge. Insulating layer 307 may be deposited onto photodetector body 317 using any blanket deposition techniques known to one of ordinary skill in the art of semiconductor manufacturing e.g., using spin-on, CVD, or sputtering technique. In alternative embodiments, insulating layer 307 may be any one, or a combination of, sapphire, silicon dioxide, silicon nitride, polymer, or other insulating materials. In one embodiment, the thickness of insulating layer 307 of silicon dioxide deposited on photodetector body 317 that includes Ge is in the approximate range of 50 nm to 100 μm. In one embodiment, after depositing, insulating layer 307 is polished back, e.g., using a chemical-mechanical polishing ("CMP") technique, to form a substantially flat top surface. The CMP technique is known to one of ordinary skill in the art of semiconductor manufacturing.

Figure 3I:
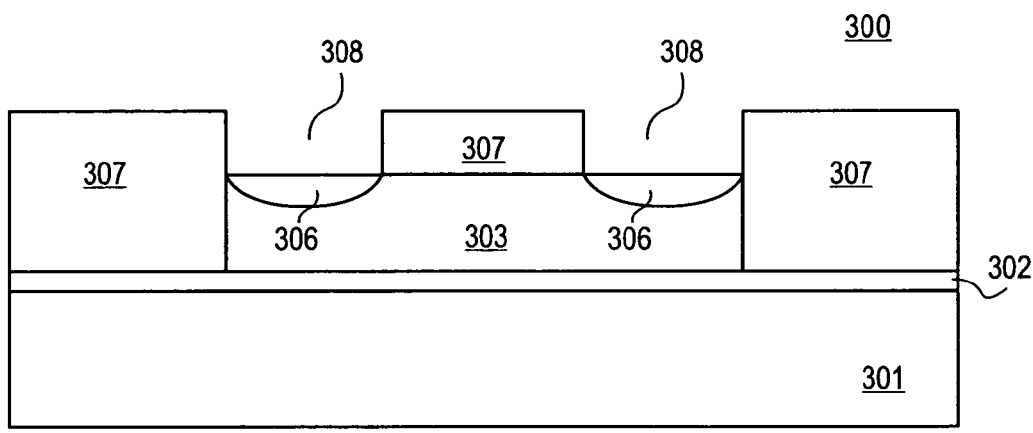
FIG. 3I is a view similar to FIG. 3H, after trenches are formed in the insulating layer to expose the delta doped layer on portions of the semiconductor layer.

FIG. 3I is a view similar to FIG. 3H, after trenches 308 are formed in insulating layer 307 to expose delta doped layer 306 on portions of semiconductor. layer 303. In one embodiment, trenches 308 are formed using a patterning and etching technique. Patterning and etching techniques are known to one of ordinary skill in the art of semiconductor manufacturing. The width of trenches 308 determines the size of contacts formed later on in the process. The distance between trenches 308 determines the pitch between contacts formed later on in the process. As shown in FIG. 3I, portions of insulating layer 307 are formed on buffer layer 302 adjacent to opposite sidewalls of photodetector body 317 that may be used to insulate the photodetector from other devices built on semiconductor substrate 301. As shown in FIG. 3I, a portion of insulating layer 307 is formed on a top surface of photodetector body 317 between portions of delta doped layer 306 that may be used to insulate from each other contacts formed later on in the process. In one embodiment, the portions of insulating layer 307 on the top surface of photodetector body 317 between portions of delta doped layer 306 and on buffer layer 302 provide an antireflective coating to MSM photodetector 300. In one embodiment, the thickness of the portions of insulating layer 307 that provide an antireflective coating is determined by operating wavelengths of MSM photodetector 300. In one embodiment, the thickness of these portions of insulating layer 307 may be in the approximate range of 10 nm to 10 μm.

Figure 3J:
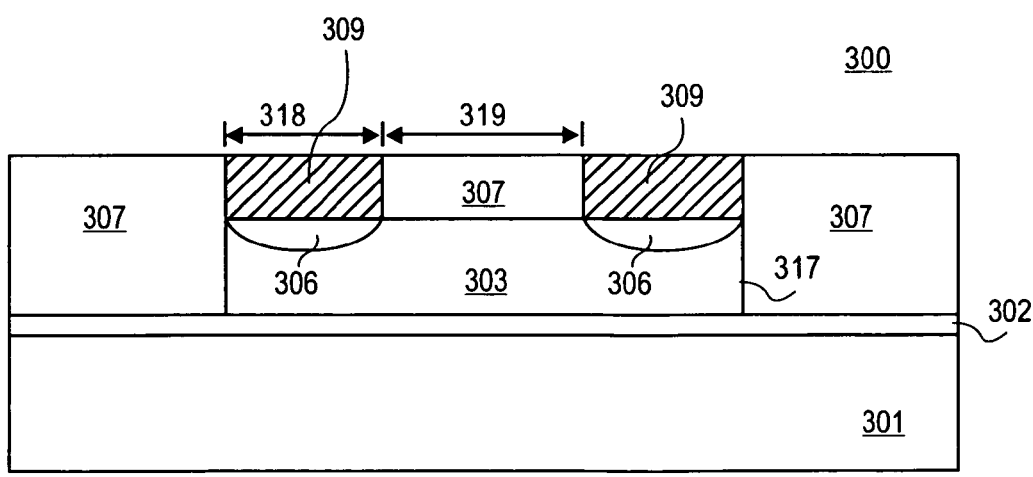
FIG. 3J is a view similar to FIG. 3I, after contacts are formed on the delta doped layer.

FIG. 3J is a view similar to FIG. 3I, after contacts 309 are formed on delta doped layer 306. As shown in FIG. 3J, delta doped layer 306 is formed on portions of semiconductor layer 303 immediately under contacts 309 to provide a Schottky barrier interface between contacts 309 and semiconductor layer 303. As shown in FIG. 3J, contacts 309 are formed by filling trenches 308 with a conductive material, e.g., a metal. In one embodiment, contacts 309 are formed using a damascene technique that includes depositing a metal layer (not shown) into trenches 308 over insulating layer 307 using e.g., electroplating, and then polishing back the metal layer to form contacts 307. In one embodiment, a barrier layer (not shown) is deposited into trenches 308 before electroplating a metal. The damascene technique is known to one of ordinary skill in the art of semiconductor manufacturing. In alternate embodiments, contacts 309 may be patterned on delta-doped layer 306 by lift-off, or subtractive etch techniques known to one of ordinary skill in the art of semiconductor manufacturing. In one embodiment, contacts 309 include include copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof. In one embodiment, contacts 309 include a metal alloy or a compound (e.g., a metal nitride) that includes copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof. In one embodiment, titanium contacts 309 are formed on delta doped layer 306 of Ge on semiconductor layer 303 of intrinsic Ge. As shown in FIG. 3J, the pitch 319 between contacts 309 defines a minimal window on a semiconductor channel of MSM photodetector 300. In one embodiment, the minimal window on the semiconductor channel of the MSM photodetector 200 is in the approximate range of 10 nanometers ("nm") to 20 microns ("μm"). In one embodiment, size 318 is in the approximate range of 0.01 μm to 10 μm, and pitch 319 is in the approximate range of 0.01 μm to 10 μm. As shown in FIG. 3J, insulating layer 307 is deposited on portions of insulating layer 302 adjacent to semiconductor layer 303 to insulate an MSM photodetector from other photodetectors and other devices. In one embodiment, contacts 309 are formed on semiconductor body 317 parallel to each other. In another embodiment, contacts 309 are deposited on semiconductor body 317 to form interdigitated interdigitized contacts. In yet another embodiment, contacts 309 are deposited on semiconductor body 317 to form interleaved contacts. Parallel, interdigitated, and interleaved contacts are known to one of ordinary skill in the art of semiconductor manufacturing.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An apparatus, comprising:
   a delta doped layer on portions of a semiconductor layer, wherein the semiconductor layer is an intrinsic germanium layer; and
   at least two metal contacts on the delta doped layer.

2. The apparatus of claim 1, wherein the thickness of the delta doped layer is less than 100 nanometers.

3. The apparatus of claim 1, wherein the semiconductor layer has a concentration of carriers less than $1 \times 10^{15}$ cm$^{-3}$.

4. The apparatus of claim 1, wherein the semiconductor layer has a concentration of carriers in a range of $1 \times 10^{12}$ cm$^{-3}$ to $1 \times 10^{15}$ cm$^{-3}$.

5. The apparatus of claim 1, wherein the delta doped layer has a dopant concentration of at least $1 \times 10^{18}$ cm$^{-3}$.

6. A metal-semiconductor-metal ("MSM") photodetector, comprising:
   metal contacts over portions of a semiconductor layer over a substrate, wherein the semiconductor layer is an intrinsic germanium layer; and
   a delta doped layer deposited between the metal contacts and the portions of the intrinsic germanium layer to reduce a dark current of the MSM photodetector.

7. The MSM photodetector of claim 6, wherein the thickness of the delta doped layer is less than 100 nanometers.

8. The MSM photodetector of claim 6, wherein the delta doped layer has a dopant concentration of at least $1 \times 10^{18}$ cm$^{-3}$.

9. A metal-semiconductor-metal ("MSM") photodetector, comprising:
   metal contacts over portions of a semiconductor layer over a substrate, wherein the semiconductor layer is an intrinsic germanium layer; and
   a delta doped layer deposited directly underneath the metal contacts on the portions of the intrinsic germanium layer to reduce a dark current of the MSM photodetector.

10. A method, comprising:
    forming a delta doped layer on portions of a semiconductor layer, wherein the semiconductor layer is an intrinsic germanium layer; and
    forming at least two metal contacts on the delta doped layer.

11. The method of claim 10, further comprising:
    forming a buffer layer between the substrate and the semiconductor layer.

12. The method of claim 10, wherein forming the delta doped layer comprises
    forming a photoresist on the semiconductor layer;
    forming openings in the photoresist to expose the portions of the semiconductor layer; and
    depositing the delta-doped layer onto exposed portions of the semiconductor layer.

13. The method of claim 10, wherein forming the contacts includes
    forming an insulating layer on the delta doped layer and on the semiconductor layer;

forming openings in the insulating layer to expose the delta doped layer; and depositing a metal layer onto the delta doped layer.

14. The method of claim 10, wherein the delta doped layer is less than 100 nanometers.

15. The method of claim 10, wherein forming the delta doped layer includes adding dopants to the portions of the semiconductor layer to a dopant concentration of at least $1 \times 10^{18}$ cm$^{-3}$.

16. The method of claim 10, wherein forming the delta doped layer includes varying a thickness of the delta doped layer to control a height of a Schottky barrier at a metal-semiconductor interface.

17. The method of claim 10, wherein forming the delta doped layer includes varying a dopant concentration in the delta doped layer to control a height of a Schottky barrier at a metal-semiconductor interface.

* * * * *